United States Patent
Ejima

(10) Patent No.: US 8,638,837 B2
(45) Date of Patent: Jan. 28, 2014

(54) RADIO COMMUNICATION APPARATUS

(75) Inventor: Takeshi Ejima, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 310 days.

(21) Appl. No.: 12/735,295

(22) PCT Filed: Jan. 27, 2009

(86) PCT No.: PCT/JP2009/051682
§ 371 (c)(1),
(2), (4) Date: Jun. 30, 2010

(87) PCT Pub. No.: WO2009/099017
PCT Pub. Date: Aug. 13, 2009

(65) Prior Publication Data
US 2010/0284450 A1    Nov. 11, 2010

(30) Foreign Application Priority Data
Feb. 8, 2008    (JP) ................. 2008-028922

(51) Int. Cl.
*H04B 1/38* (2006.01)
(52) U.S. Cl.
USPC ............ 375/219; 375/220; 375/297; 375/318
(58) Field of Classification Search
USPC ......................................... 375/136, 132, 345
See application file for complete search history.

(56) References Cited

U.S. PATENT DOCUMENTS

| | | | | |
|---|---|---|---|---|
| 6,104,919 A | * | 8/2000 | Lyall et al. | ............. 455/249.1 |
| 6,959,055 B2 | * | 10/2005 | Litwin et al. | ............. 375/345 |
| 2004/0017865 A1 | | 1/2004 | Litwin, Jr. et al. | |
| 2005/0079825 A1 | * | 4/2005 | Omori et al. | ............. 455/67.11 |
| 2007/0058739 A1 | * | 3/2007 | Aytur et al. | ................. 375/345 |
| 2007/0076783 A1 | | 4/2007 | Dishman et al. | |
| 2007/0147479 A1 | | 6/2007 | Yamasuge | |
| 2009/0042525 A1 | * | 2/2009 | Rajagopal et al. | ......... 455/232.1 |

FOREIGN PATENT DOCUMENTS

| | | |
|---|---|---|
| EP | 1 626 498 | 2/2006 |
| JP | 62-176335 | 8/1987 |
| JP | 2002-094408 | 3/2002 |
| JP | 2005-534252 | 11/2005 |
| JP | 2006-229739 | 8/2006 |
| JP | 2007-142602 | 6/2007 |
| JP | 2009-005112 | 1/2009 |
| WO | WO 2006/118184 | 9/2006 |
| WO | WO 2007/022417 | 2/2007 |

OTHER PUBLICATIONS

WiMedia Alliance, Inc., "Mac-Phy Interface Specification", Release 1.5, Layne Lisenbee, Technical Editor, Dec. 1, 2009.

(Continued)

*Primary Examiner* — Sam K Ahn
*Assistant Examiner* — Janice Tieu
(74) *Attorney, Agent, or Firm* — Harness, Dickey & Pierce, P.L.C.

(57) ABSTRACT

A disclosed radio communication apparatus includes an amplifier configured to amplify a signal received via one of multiple channels including a channel where frequency hopping is conducted; a signal strength measurement circuit configured to measure signal strength of the received signal; and a gain value computation unit configured to compute a gain value for the amplifier based on the signal strength measured by the signal strength measurement circuit. The gain value computation unit is configured to use values specific to the respective channels as coefficients of a function to compute the gain value.

10 Claims, 13 Drawing Sheets

(56) References Cited

OTHER PUBLICATIONS

WiMedia Alliance, Inc., "MultiBand OFDM Physical Layer Specification", Final Deliverable 1.5, William Stoye, Technical Editor, Aug. 11, 2009.

Office Action dated May 10, 2011 issued in corresponding Japanese Application No. 2008-028922.
Search Report for corresponding European Application No. 09707529.5 dated Oct. 8, 2013.

* cited by examiner

FIG.3

| Reserve [7] | TFC [6] | Band Group [5:3] | TFC [2:0] |

TXCHAN (0x02)

| Reserve [7] | TFC [6] | Band Group [5:3] | TFC [2:0] |

RXCHAN (0x04)

FIG.5

| AGC_PARAM (0xA0) | gradient [7:4] | intercept [3:0] |

FIG.13
Conventional Art

| TFC | BAND | | | | | |
|---|---|---|---|---|---|---|
| 1 | 1 | 2 | 3 | 1 | 2 | 3 |
| 2 | 1 | 3 | 2 | 1 | 3 | 2 |
| 3 | 1 | 1 | 2 | 2 | 3 | 3 |
| 4 | 1 | 1 | 3 | 3 | 2 | 2 |
| 5 | 1 | 1 | 1 | 1 | 1 | 1 |
| 6 | 2 | 2 | 2 | 2 | 2 | 2 |
| 7 | 3 | 3 | 3 | 3 | 3 | 3 |
| 8 | 1 | 2 | 1 | 2 | 1 | 2 |
| 9 | 1 | 3 | 1 | 3 | 1 | 3 |
| 10 | 2 | 3 | 2 | 3 | 2 | 3 |

RADIO COMMUNICATION APPARATUS

TECHNICAL FIELD

The present invention relates to a radio communication apparatus for radio communications of signals modulated in MB-OFDM (Multi Band-Orthogonal Frequency Division Multiplexing) scheme.

BACKGROUND ART

UWB (Ultra Wide Band) is a radio communication scheme where a wide frequency band in bandwidth of 7.5 GHz ranging from 3.1 GHz to 10.6 GHz is used. A specification for physical layers in the UWB is standardized in IEEE 802.15.3a by IEEE (The Institute of Electrical and Electronic Engineers) working for defining standard specifications.

In the physical layer in the UWB, two modulation schemes MB-OFDM (Multi Band-Orthogonal Frequency Division Multiplexing) and DS-UWB (Direct Spread-UWB) are employed.

In the MB-OFDM, the whole band ranging from 3.1 GHz to 10.6 GHz is divided into 14 bands (frequency bands). For each of the divided bands, QPSK (Quadrature Phase Shift Keying) is conducted in primary modulation for carrying digital signals in radio waves, and OFDM (Orthogonal Frequency Division Multiplexing) is conducted in secondary modulation for achieving communications tolerant to interference from other radio waves.

In the DS-UWB, a lower band from 3.1 GHz to 4.9 GHz and a higher band from 6.2 GHz to 9.7 GHz are used. For signal transmission, the QPSK or BPSK (Binary Phase Shift Keying) is conducted in the primary modulation and CDMA (Code Division Multiple Access) is conducted in the secondary modulation. Also, a direct frequency spread scheme is used in the DS-UWB in the transmission of signals.

In the UWB, these modulation schemes are used to reduce transmission power levels. Specifically, the FCC (Federal Communications Commission) specifies that EIRP (Equivalent Isotropically Radiated Power) indicative of regulated transmission power level per 1 MHz in the UWB be less than or equal to −41.25 dBm. This level corresponds to about 0.5 mW of total power, which may be about 1/20 of total power of the PHS (Personal Handy-Phone System).

In the MB-OFDM, each of the 14 bands is assigned to a band group including two or three bands. Bands 1-3 are assigned to band group 1, bands 4-6 are assigned to band group 2, bands 7-9 are assigned to band group 3, bands 10-12 are assigned to band group 4, and bands 13-14 are assigned to band group 5.

Also, in the MB-OFDM, frequency hopping is used. The frequency hopping is a technique for communications through continuous transition of a communicating band to other bands as illustrated in FIG. 12.

Even in cases where an error occurs in communicated data due to noise having occurred in a certain frequency, the continuous transition between communicating bands could correct the error-occurring data by using data communicated in other bands.

In the MB-OFDM, patterns for frequency hopping are defined as TFC (Time Frequency Code) as illustrated in FIG. 13. In FIG. 13, TFC 1 is illustrated to have the frequency hopping pattern "BAND 1→BAND 2→BAND 3→BAND 1→BAND 2→BAND 3." Also, TFC 5 is illustrated to use only BAND 1 without frequency hopping.

If it is not specified in upper layers which channel is used to transmit what data, the band groups are defined depending on regions in countries. On the other hand, TFCs are selected in the sequence specified in the MB-OFDM. In this manner, the band groups and the TFCs are determined, and accordingly channels are determined.

In conventional radio communication apparatuses, AGC (Automatic Gain Control) is conducted for suppressing fluctuation of the amplitude of a received electrical signal and converting it into a signal with a constant amplitude. In AGC, gain (amplification degree) is increased for a small amplitude signal based on RSSI (Received Signal Strength Indicator) while gain is decreased for a large amplitude signal.

As one implementation of AGC, Japanese Laid-Open Patent Publication 2002-94408 discloses an arrangement including a first attenuator provided between a front-end or a high frequency amplifier and a mixer, a RSSI circuit for generating a RSSI output signal from a received signal, and a second attenuator provided before the RSSI circuit for adjusting an input signal level. In this arrangement, the RSSI output signal is compared to two thresholds. If it is outside of the thresholds, the attenuation amount of the second attenuator and then the attenuation amount of the first attenuator are adjusted to substantially enlarge a dynamic range of input and output in/from the RSSI circuit and prevent saturation of the mixer, the AGC circuit, and other system circuits in strong electric fields without sacrificing modulation performance in weak electric fields.

As another implementation of the AGC, Japanese Laid-Open Patent Publication 2005-534252 discloses an arrangement including a RSSI circuit for measuring the RSSI of a received signal, an analog amplifier for amplifying the received signal, an analog-to-digital converter for converting the amplified signal into a digital signal, a digital AGC loop for determining digital gain based on the converted digital signal, and a digital-to-analog converter for setting the digital gain determined by the digital AGC loop in the analog amplifier. In a spectral spread system, this arrangement enables the system to follow a rapid tracking variation while averaging noise.

As another implementation of the AGC, Japanese Laid-Open Patent Publication 2006-229739 discloses an arrangement where gain correction is conducted corresponding to individual bands prior to AGC whenever the frequency hopping causes the bands to be switched.

As stated above, the TFC consists of band groups each including several bands, and in some TFCs, the frequency hopping is conducted through transition between the bands.

However, signal strength measurement circuits for measuring the strength of received signals, such as the RSSI circuit, may not have uniform measurement performance over the respective bands. For example, even if received signals have the same strength, a strength value for a certain band measured by the signal strength measurement circuit may be higher than a strength value for another band measured by the signal strength measurement circuit.

In conventional radio communication apparatuses as disclosed in Japanese Laid-Open Patent Publications 2002-94408 and 2005-534252, AGC operations in consideration of such measurement errors between bands in the signal strength measurement circuit are impossible.

In addition, the band switching period for the frequency hopping is specified to be relatively short, such as 312.5 ns, in the MB-OFDM specification. Thus if the MB-OFDM is applied to a conventional radio communication apparatus as disclosed in Japanese Laid-Open Patent Publication 2006-229739, particularly if analog AGC is conducted in such a conventional radio communication apparatus, the AGC operation may not be able to follow the above-stated fast band switching.

DISCLOSURE OF INVENTION

The present invention addresses the above-mentioned conventional problems. One object of the present invention is provide a radio communication apparatus for enabling the AGC operation to follow the high-speed band switching in consideration of measurement errors between the respective bands in the signal strength measurement circuit.

One feature of the present invention relates to a radio communication apparatus including an amplifier configured to amplify a signal received via one of multiple channels including a channel where frequency hopping is conducted; a signal strength measurement circuit configured to measure signal strength of the received signal; and a gain value computation unit configured to compute a gain value for the amplifier based on the signal strength measured by the signal strength measurement circuit, wherein the gain value computation unit is configured to use values specific to the respective channels as coefficients of a function to compute the gain value.

According to this feature, the radio communication apparatus achieves AGC operations allowed to follow fast band switching in consideration of measurement errors between different bands in the signal strength measurement circuit in order to compute a gain value by substituting the signal strength into a function with coefficients specific to different channels.

For example, the gain value computation unit may use a linear function to compute the gain value.

In one embodiment, the radio communication apparatus may include a register complying with a WiMedia MAC-PHY interface specification; and a MAC unit configured to write a value in the register, wherein the MAC unit is configured to write the coefficients in the register prior to writing in the register a value indicative of the channel via which the signal is received, and the gain value computation unit is configured to use the coefficients written in the register as the coefficients of the function to compute the gain value.

According to this embodiment, the radio communication apparatus can be easily implemented by a radio communication apparatus complying with the WiMedia MAC-PHY interface specification to write the coefficients in the register via the MAC unit and compute the gain value based on the coefficients.

In one embodiment, the MAC unit may be configured to write the coefficients in a range in the register in the WiMedia MAC-PHY interface specification, the range being where a vendor is allowed to assign proprietary coefficients.

According to this embodiment, the radio communication apparatus can be implemented to comply with the WiMedia MAC-PHY interface specification.

In one embodiment, the radio communication apparatus may include a table storage unit configured to store a table including correspondence between the channels and the coefficients, wherein the MAC unit is configured to write the coefficients in the register based on the table in the table storage unit.

According to this embodiment, the radio communication apparatus can modify coefficients for different channels without modification of hardware, firmware and software by changing the table stored in the table storage unit.

In one embodiment, the radio communication apparatus may include an analog-to-digital conversion unit configured to perform analog-to-digital conversion on the received signal, wherein the signal strength measurement circuit is configured to measure signal strength of the received analog signal, and the amplifier is configured to amplify the received digital signal converted by the analog-to-digital conversion unit.

According to this embodiment, the radio communication apparatus can improve AGC characteristics if gain control for a narrow bandwidth is needed to measure the signal strength of a received analog signal and amplify the resulting digital signal.

In one embodiment, the signal strength measurement circuit may be configured to measure signal strength of the received analog signal, and the amplifier may be configured to amplify the received analog signal.

According to this embodiment, the radio communication apparatus can improve AGC characteristics if a received fast signal with a higher S/N (Signal to Noise) ratio is amplified to measure the signal strength of a received analog signal and amplify the received analog signal.

In one embodiment, the radio communication apparatus may include a coefficient determination unit configured to determine a coefficient suitable for a frequency band of a channel where the frequency hopping is not conducted as a coefficient of the channel and determine an average value of coefficients suitable for different hopping frequency bands of a channel where the frequency hopping is conducted as a coefficient of the channel.

In one embodiment, the radio communication apparatus may include a coefficient determination unit configured to determine a coefficient suitable for a frequency band of a channel where the frequency hopping is not conducted as a coefficient of the channel and determine a coefficient of a channel where the frequency hopping is conducted based on a sample variance suitable for different hopping frequency bands.

According to these embodiments, the radio communication apparatus can compute the gain value in consideration of deviations between coefficients for hopping frequency bands in order to determine coefficients for channels where frequency hopping is conducted based on sample variance among the coefficients suitable for the frequency bands.

In one embodiment, the coefficient determination unit may be configured to weight individual terms of the sample variance.

According to this embodiment, the radio communication apparatus can prevent a gain value unsuitable for a frequency band if a coefficient suitable for a certain frequency band significantly deviates from coefficients suitable for the other frequency bands in hopping frequency bands.

In one embodiment, the radio communication apparatus may include a transmission unit configured to transmit a baseband signal in consecutively changed frequency bands; an attenuator configured to attenuate the baseband signal; and an attenuation rate configuration unit configured to set an attenuation rate of the attenuator, wherein the signal strength measurement circuit is configured to measure signal strength of the baseband signal as the received signal, and the coefficient determination unit is configured to determine a coefficient suitable for each of the frequency bands based on the signal strength.

According to this embodiment, the radio communication apparatus can determine coefficients for different channels in consideration of measurement errors due to different instances of the signal strength measurement circuit.

According to the above-mentioned features of the present invention, a constant current supply type switching regulator can convert an input voltage into a desired output current without the use of any current detecting resistor, which may reduce the number of elements in the switching regulator and alleviate loss otherwise caused by an incoming current to the resistor.

BRIEF DESCRIPTION OF DRAWINGS

FIG. 3 is a schematic diagram illustrating an assignment within TXCHAN and RXCHA registers assigned to a PHY/RF register in a radio communication apparatus according to one embodiment of the present invention;

FIG. 5 is a schematic diagram illustrating an assignment within a AGC_PARAM register assigned to a PHY/RF register in a radio communication apparatus according to one embodiment of the present invention;

FIG. 13 is a schematic diagram illustrating relationships between bands and TFCs in the MB-OFDM.

DESCRIPTION OF EMBODIMENTS

Figure 1:
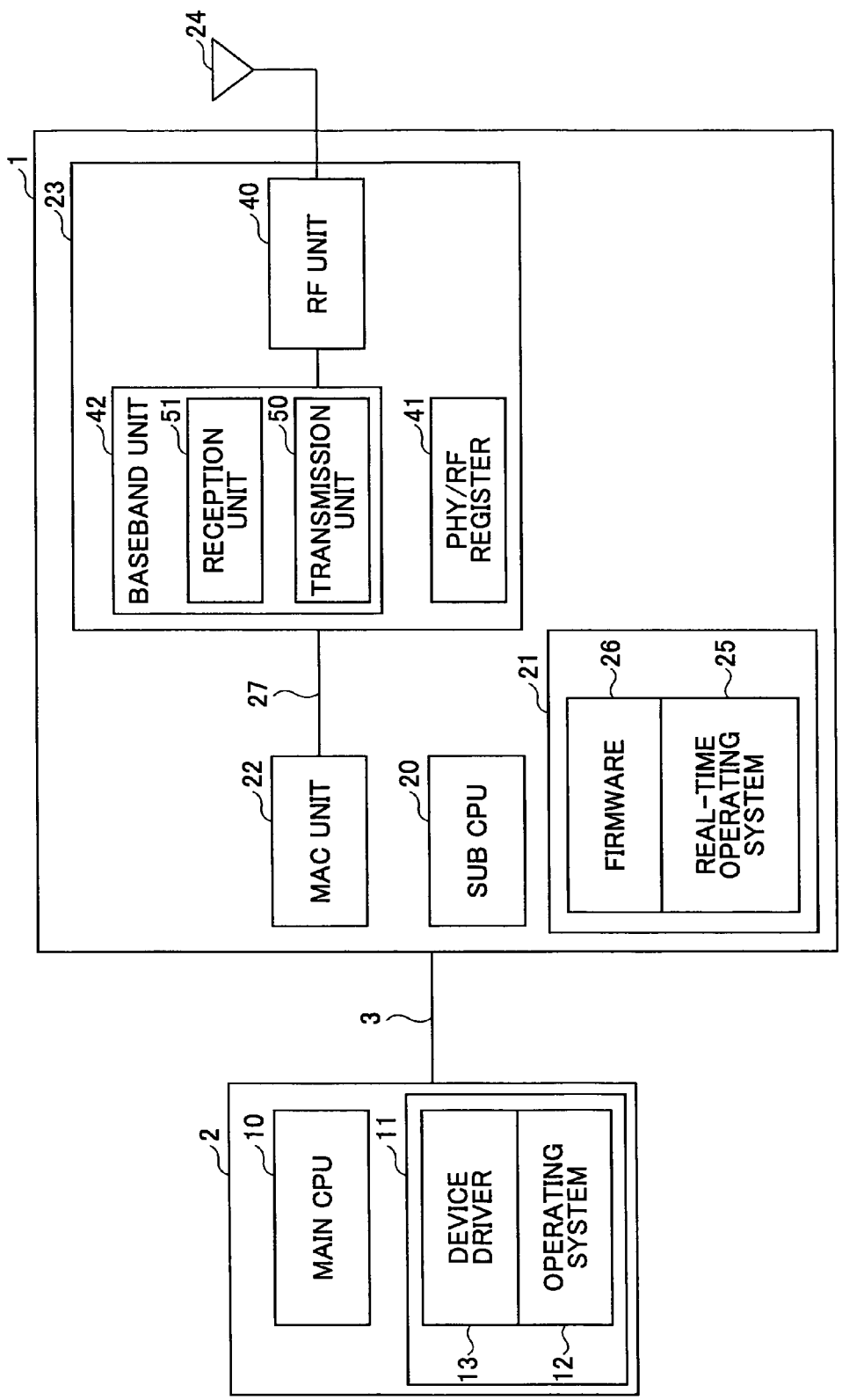
FIG. 1 is a block diagram illustrating a radio communication apparatus according to one embodiment of the present invention.

Embodiments of the present invention will be described with reference to the accompanying drawings in detail below. FIG. 1 is a block diagram illustrating a radio communication apparatus according to one embodiment of the present invention.

In this embodiment, a radio communication apparatus 1 is coupled to a host controller 2 via a PCI (Peripheral Component Interconnect)-Express bus 3. The host controller 2 includes a main CPU (Central Processing Unit) 10 and a memory 11.

The main CPU 10 uses the memory 11 to run an operating system 12 and to execute a device driver 13 on the operating system 12.

The device driver 13 communicates data to the radio communication apparatus 1 via the PCI-Express bus 3 and controls the radio communication apparatus 1 by reading and writing values from/in a register in a MAC (Media Access Controller) unit 22 as described below.

The radio communication apparatus 1 includes a sub CPU 20, a memory 21, the MAC unit 22 for generating and/or filtering data frames, a PHY (Physical Layer) unit 23 for signal processing such as frequency conversion and an antenna 24.

The sub CPU 20 uses the memory 21 to run a real-time operating system 25 and executes firmware 26 for controlling components in the MAC unit 22 on the real-time operating system 25.

The sub CPU 20 may configure a register (not illustrated) in the MAC unit 22 and/or communicate data to the host controller 2 in execution of the firmware 26. Also, the sub CPU 20 may read and/or write values from/in a PHY/RF register 41 as described below in the PHY unit 23 via a WiMedia MAC-PHY interface bus 27 in execution of the firmware 26.

The MAC unit 22 and the PHY unit 23 may perform operations based on specifications of WiMedia MAC and MB-OFDM. Communications between the MAC unit 22 and the PHY unit 23 may be specified in conformity with the WiMedia MAC-PHY interface specification. Thus, the MAC unit 22 and the PHY unit 23 distributed by different vendors can be connected to each other and used together.

Figure 2:
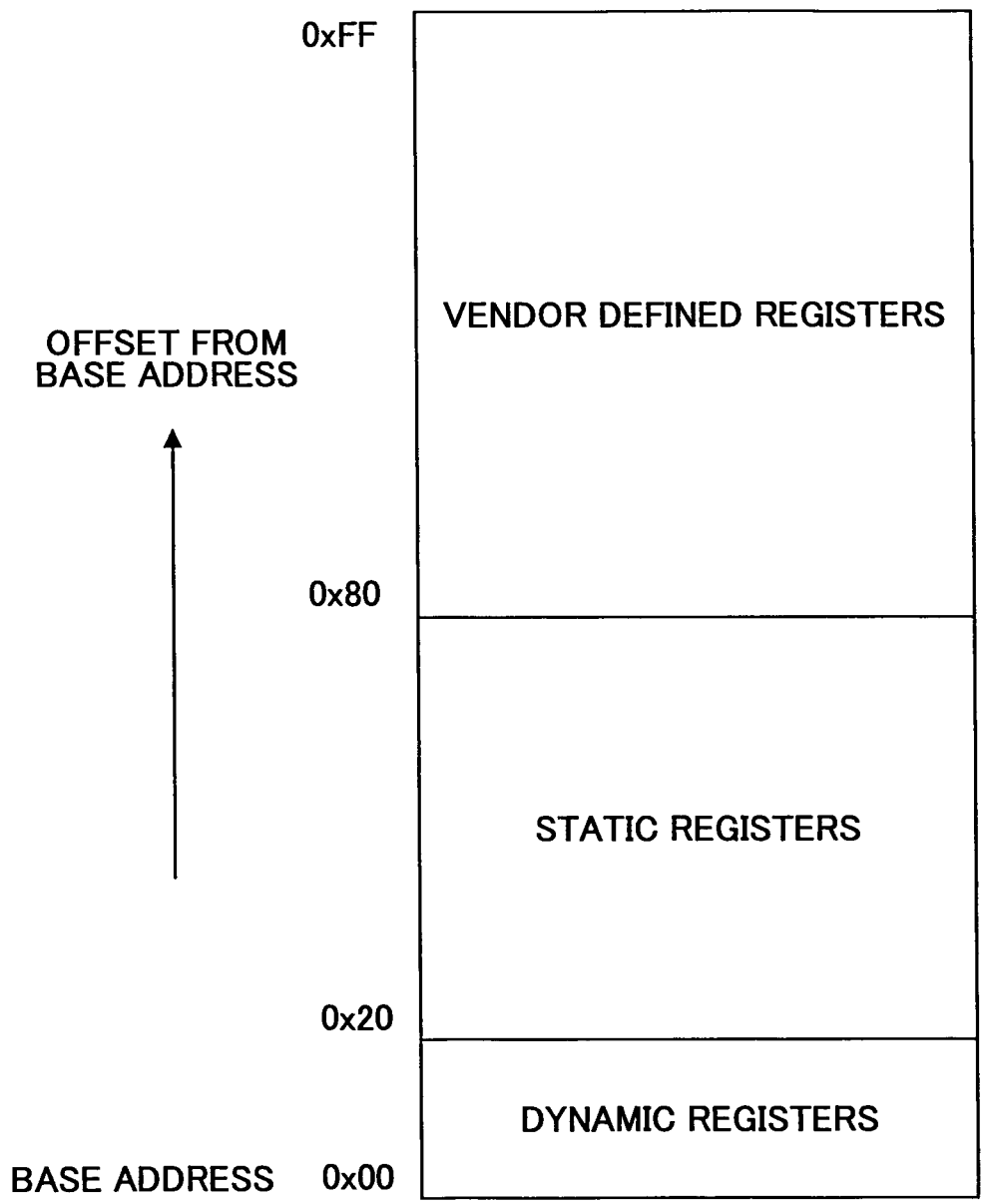
FIG. 2 is a schematic diagram illustrating an assignment of PHY/RF registers in a radio communication apparatus according to one embodiment of the present invention.

In the WiMedia MAC-PHY interface specification, as illustrated in FIG. 2, a range from a base address (reference address) "0x00" to address "0x20" in the PHY/RF register 41 is defined as a range for storing dynamic configurations (dynamic register set).

For example, as illustrated in FIG. 3, a transmitted TFC and a band group are set in a TXCHAN register at address "0x02" while a received TFC and a band group are set in a RXCHAN register at address "0x04".

For this reason, the sub CPU 20 for executing the firmware 26 configures a transmission channel by writing the TFC and the band group in the TXCHAN register via the MAC unit 22 and a reception channel by writing the TFC and the band group in the RXCHAN register via the MAC unit 22.

Also in the WiMedia MAC-PHY interface specification, a range from address "0x20" to address "0x80" in the PHY-RF register 41 is defined as a range for storing static configurations (static register set) such as communication speed and the number of configurable signal transmission levels supported by the radio communication apparatus 1.

Also in the WiMedia MAC-PHY interface specification, a range from address "0x80" to address "0xFF" in the PHY/RF register 41 is defined as a range for storing configurations specific to vendors (vendor range).

In FIG. 1, the MAC unit 22 attaches a MAC header to a data frame to be transmitted to the PHY unit 23, encrypts the MAC header attached data frame and transmits the encrypted data frame to the PHY unit 23 via the WiMedia MAC-PHY interface bus 27.

Also, the MAC unit 22 decrypts a received data frame from the PHY unit, analyzes the decrypted data frame and filters or extracts data to be further transmitted to an upper protocol from data obtained from the data frame based on the analysis.

The PHY unit 23 includes a RF (Radio Frequency) unit 40, the PHY/RF register 41 and a baseband unit 42, and the baseband unit 42 includes a transmission unit 50 and a reception unit 51.

The RF unit 40 performs MB-OFDM modulation on a baseband signal supplied from the transmission unit 50 in the baseband unit 42 to transmit the signal as a radio wave via the antenna 24 over the air.

Also, the RF unit 40 demodulates the MB-OFDM modulated signal received via the antenna 24 into a baseband signal and supplies the demodulated baseband signal to the reception unit 51 in the baseband unit 42.

The transmission unit 50 in the baseband unit 42 D/A (Digital-to-Analog) converts a digital data frame received from the MAC unit 22 via the WiMedia MAC-PHY interface bus 27 into an analog baseband signal and supplies the converted baseband signal to the RF unit 40.

The reception unit 51 in the baseband unit 42 A/D (Analog-to-Digital) converts a baseband signal received from the RF unit 40 into a digital data frame and transmits the converted data frame to the MAC unit 22 via the WiMedia MAC-PHY interface bus 27.

Figure 4:
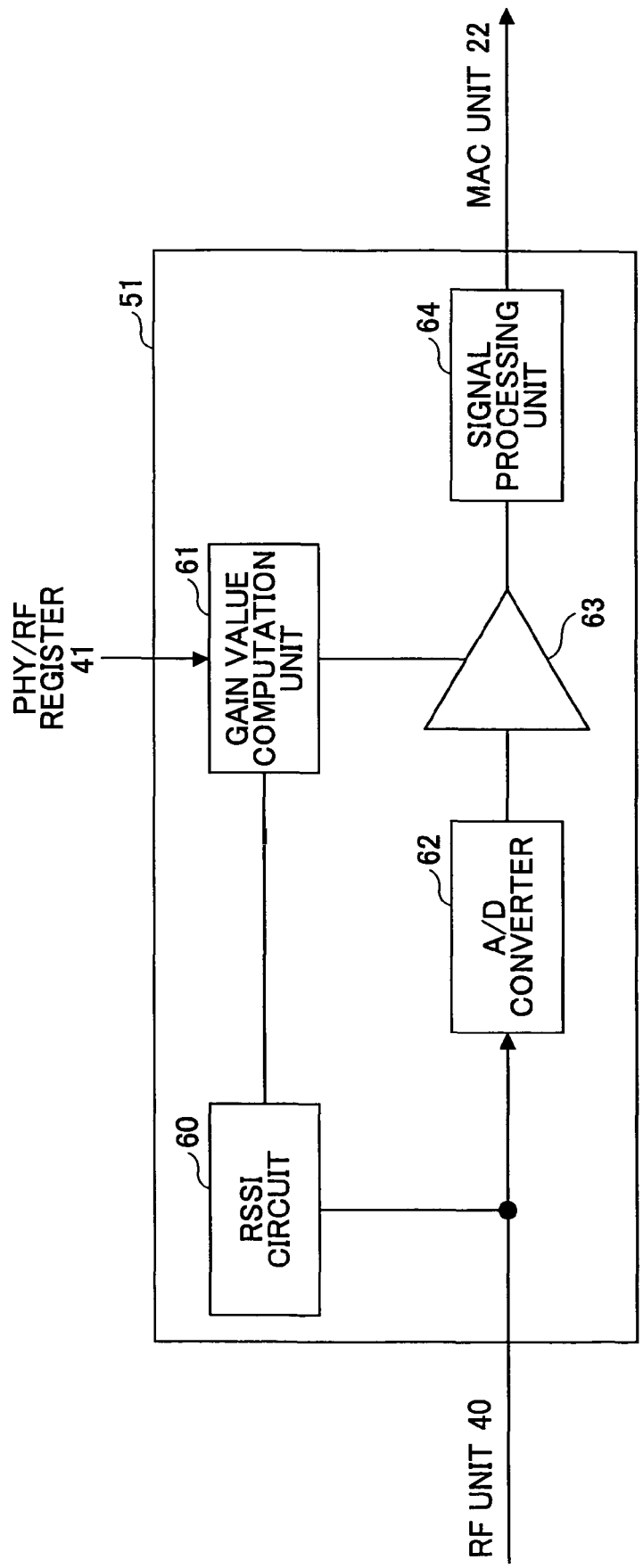
FIG. 4 is a block diagram illustrating a reception unit in a baseband unit in a radio communication apparatus according to one embodiment of the present invention.

FIG. 4 shows an exemplary arrangement of the reception unit 51 in the baseband unit 42. The reception unit 51 in the baseband unit 42 includes a RSSI circuit 60, a gain value computation unit 61, an A/D converter 62, an amplifier 63 and a signal processing unit 64.

The RSSI circuit 60 measures RSSI as received signal strength of an analog baseband signal supplied from the RF unit 40 and supplies a signal indicative of the measured RSSI to the gain value computation unit 61. Note that the RSSI circuit 60 may serve as a signal strength measurement circuit according to an embodiment of the present invention.

The gain value computation unit 61 computes a gain value based on the RSSI indicative of the signal supplied from the RSSI circuit 60 and one or more values configured in the PHY/RF register 41 and supplies a signal indicative of the computed gain value to the amplifier 63.

The values set in the PHY/RF register 41 herein means one or more gain control parameters (hereinafter referred to as "AGO_PARAM register") written in a certain address, such as address "0xA0" relative to the base address, within the vendor range in the PHY/RF register 41 in FIG. 2.

Figure 5:
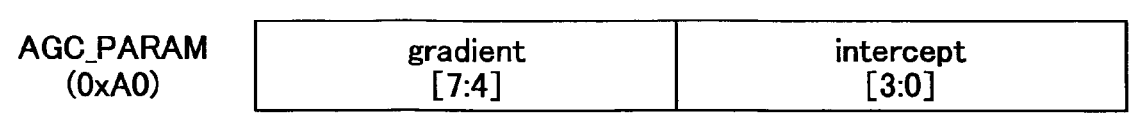

In the AGC_PARAM register, as illustrated in FIG. 5, a coefficient "gradient" indicative of the gradient of a linear function for finding an input signal from the RSSI is located in upper 4 bits, and a coefficient "intercept" indicative of the intercept of the linear function is located in lower 4 bits.

The coefficients "gradient" and "intercept" for different channels are associated with each other in a table stored in the memory 21 in advance. In this manner, the memory 21 may serve as a table storage unit according to the present invention. In this embodiment, it is assumed that the coefficients "gradient" and "intercept" for the channels are predetermined through prior measurement.

For example, if no frequency hopping is conducted in a channel, the coefficients "gradient" and "intercept" suitable for a band in that channel is stored in the table. On the other hand, if frequency hopping is conducted in a channel, respective average values of the coefficients "gradient" and "intercept" suitable for individual bands are stored in the table.

The sub CPU 20 for executing the firmware 26 may set the AGC_PARAM register prior to setting the RXCHAN register in the PHY/RF register 41.

In FIG. 4, the gain value computation unit 61 computes a gain value based on corrected RSSI (hereinafter referred to as "cRSSI") through substitution of the RSSI into a linear function with the coefficients "gradient" and "intercept" in the AGC_PARAM register.

Figure 6:
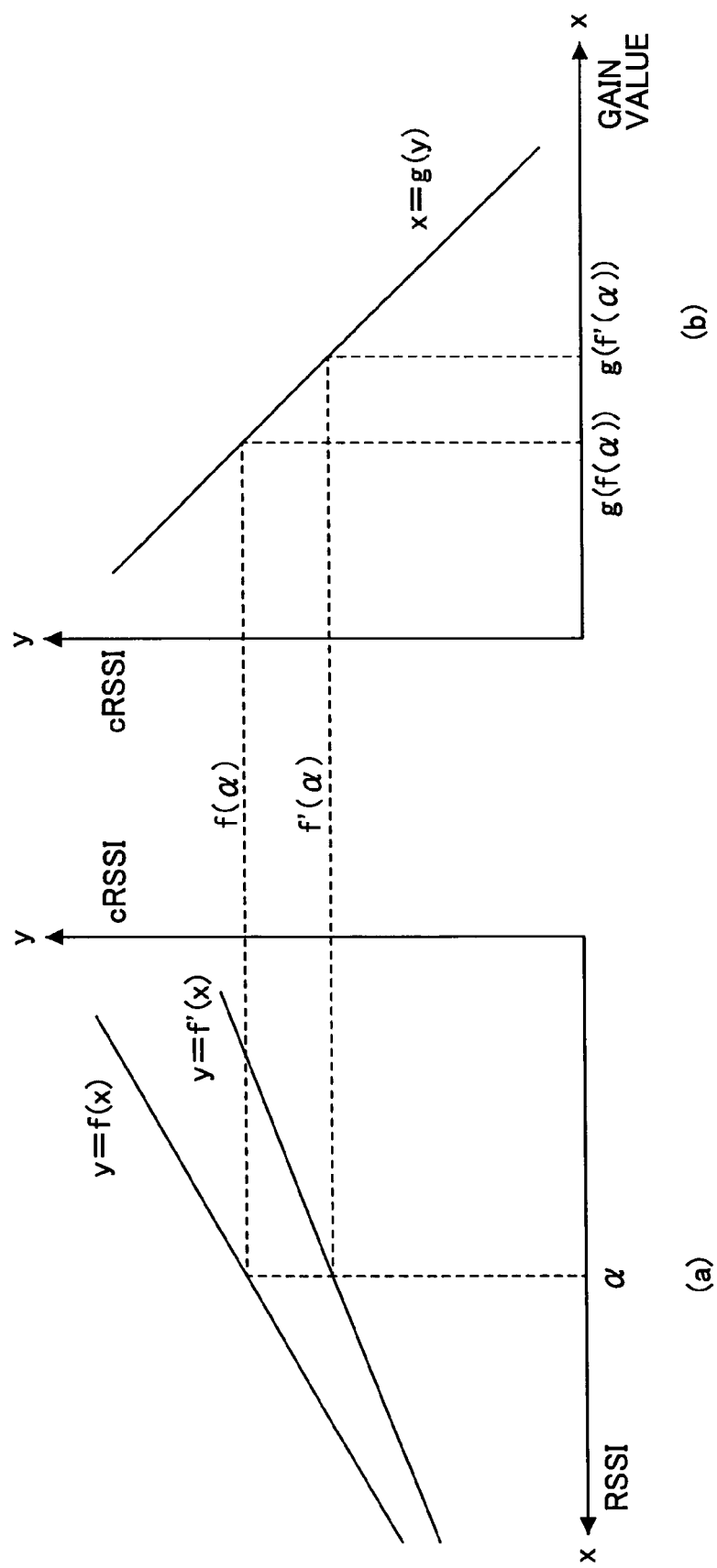
FIG. 6 is a schematic diagram illustrating a computation operation for a gain value in a gain value computation unit in a radio communication apparatus according to one embodiment of the present invention.

Specifically, as illustrated in FIG. 6, the gain value computation unit 61 may substitute the RSSI $(=\alpha)$ into the linear function with the coefficients "gradient" and "intercept" in the AGC_PARAM register and substitute the cRSSI $(=f(\alpha))$, which is an output of the linear function, into a predefined linear function $g(x)$ to compute the gain value $g(f(\alpha))$ for the amplifier 63.

For a signal with uniform strength, for example, if the RSSI measured by the RSSI circuit 60 for a certain band is higher than the RSSI measured by the RSSI circuit 60 for a reference band, a linear function $f'(x)$ with the coefficients "gradient" and "intercept" at least one of which is smaller than the coefficients of the linear function $f(x)$ for the reference band is used, and thus the cRSSI $(=f'(\alpha))$ obtained through substitution of the RSSI $(=\alpha)$ into $f'(x)$ would be smaller than the cRSSI $(=f(\alpha))$ for the reference band.

In other words, the gain value computed by the gain value computation unit 61 becomes $g(f'(\alpha))$ by estimating the RSSI measured by the RSSI circuit 60 to be relatively small, resulting in a gain value larger than the gain value $g(f(\alpha))$.

In FIG. 4, the A/D converter 62 converts an analog signal supplied from the RF unit 40 into a digital signal and supplies the digital signal to the amplifier 63.

The amplifier 63 amplifies the digital signal supplied from the A/D converter 62 based on the gain value represented by a signal supplied from the gain value computation unit 61 and supplies the amplified digital signal to the signal processing unit 64.

For example, the signal processing unit 64 may perform frequency conversion and/or other operations on the amplified digital signal and transmit the resulting signal as a data frame to the MAC unit 22.

Figure 7:
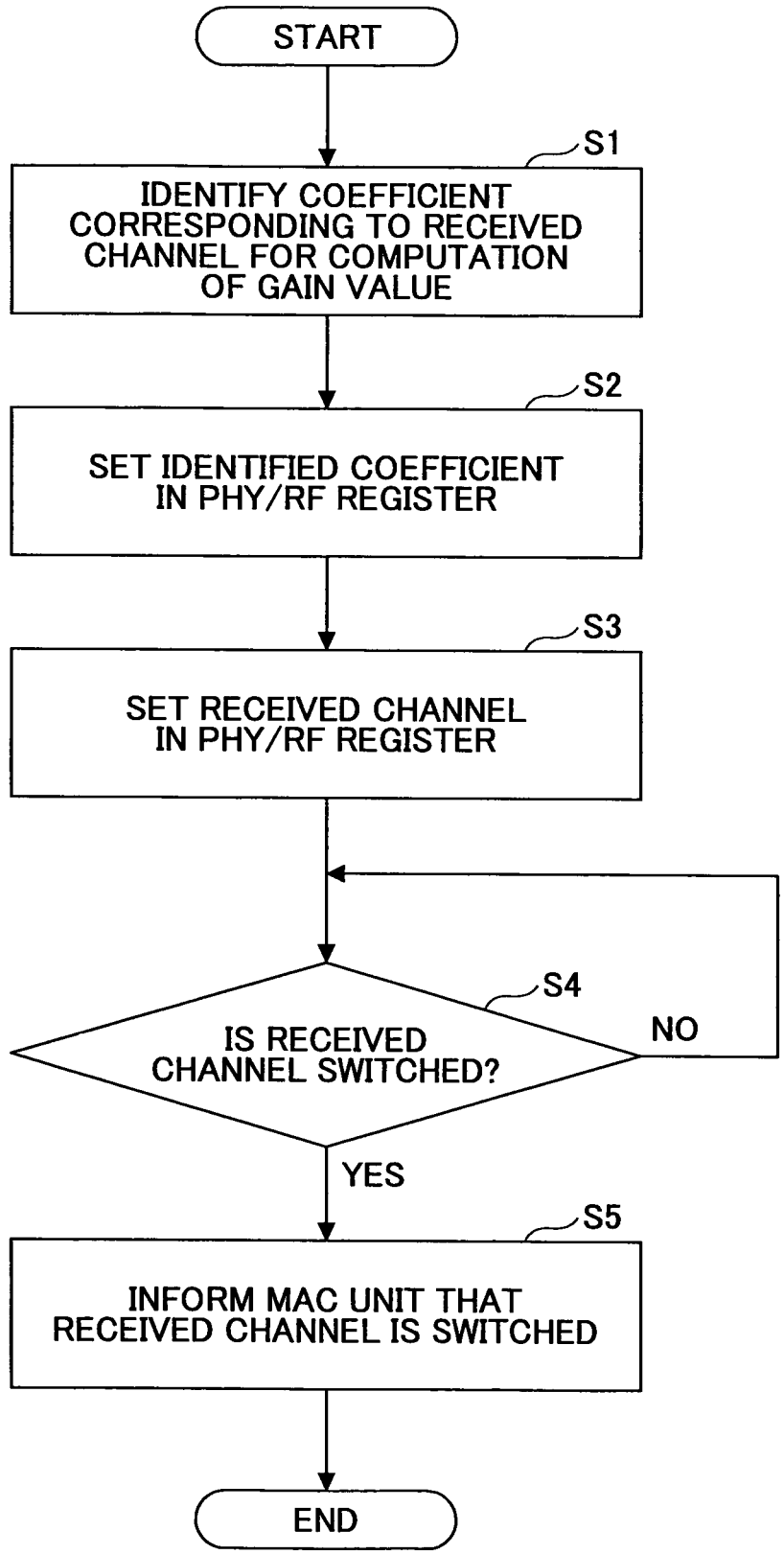
FIG. 7 is a flowchart of a reception channel configuration operation in a radio communication apparatus according to one embodiment of the present invention.

Exemplary configuration operations of a reception channel in the radio communication apparatus 1 including the above-stated components are described in detail with reference to FIG. 7.

The WiMedia MAC-PHY interface specification specifies that if a channel is changed during communication, a beacon frame with "Channel Change Information Element" (hereinafter referred to as "Channel Change IE") may be transmitted to a communicating opponent apparatus.

The "Channel Change IE" may include the next new channel and information such as a time period until transition to the new channel. Upon receiving this beacon frame, the communicating opponent apparatus uses a transmission channel or a reception channel as a new channel based on the information in the Channel Change IE.

In this manner, the configuration operations of the received channel is performed in response to activation and/or degradation of communication conditions as well as based on the information in the Channel Change IE transmitted by the communicating opponent apparatus.

At step S1, the coefficients "gradient" and "intercept" corresponding to a received channel to be configured are identified by the sub CPU 20 in a table stored in the memory 21.

At step S2, the identified coefficients "gradient" and "intercept" are set by the sub CPU 20 in the AGC_PARAM register in the PHY/RF register 41 via the MAC unit 22.

At step S3, the received channel, that is, a TFC and a band group, are set by the sub CPU 20 in the RXCHAN register in the PHY/RF register 41 via the MAC unit 22.

As a result, when the received channel is switched in the PHY unit 23 at step S4, the PHY unit 23 informs the sub CPU 20 via the MAC unit 22 that the received channel has been switched at step S5.

In this manner, according to this embodiment of the present invention, the radio communication apparatus 1 computes gain values through substitution of the RSSI into a function with coefficients specific to respective channels. As a result, whenever a band is switched in a channel where frequency hopping is conducted, the radio communication apparatus 1 does not have to change the gain value and can perform AGC operations to enable fast band switching to be followed in consideration of measurement errors between bands in the signal strength measurement circuit.

Figure 8:
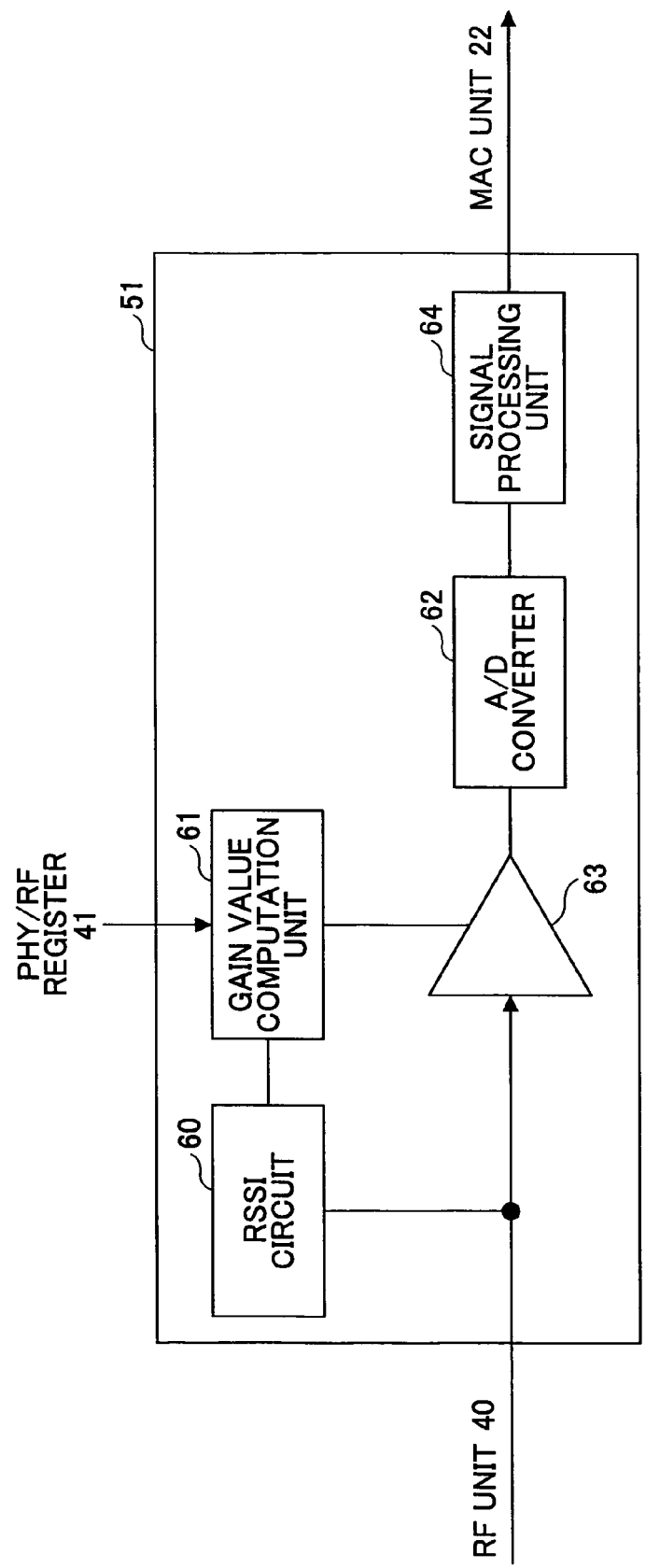
FIG. 8 is a block diagram illustrating a reception unit in a baseband unit in a radio communication apparatus according to another embodiment of the present invention.

In this embodiment, the amplifier 63 amplifies a digital signal supplied from the A/D converter 62. As illustrated in FIG. 8, in another embodiment, the amplifier 63 may amplify a received analog signal and supply the amplified signal to the A/D converter 62.

In this case, the signal strength is measured from the received analog signal, and the received analog signal is amplified. Thus, AGC characteristics can be improved in amplification of the received signal if the signal is fast and has a high S/N (Signal to Noise) ratio.

Also, in this embodiment, the gain value computation unit 61 uses a certain linear function to compute the cRRSI from the RSSI. In another embodiment, the gain value computation unit 61 may use another linear function corresponding to frequency characteristics of the RSSI circuit 60 to compute the cRSSI from the RSSI.

Figure 9:
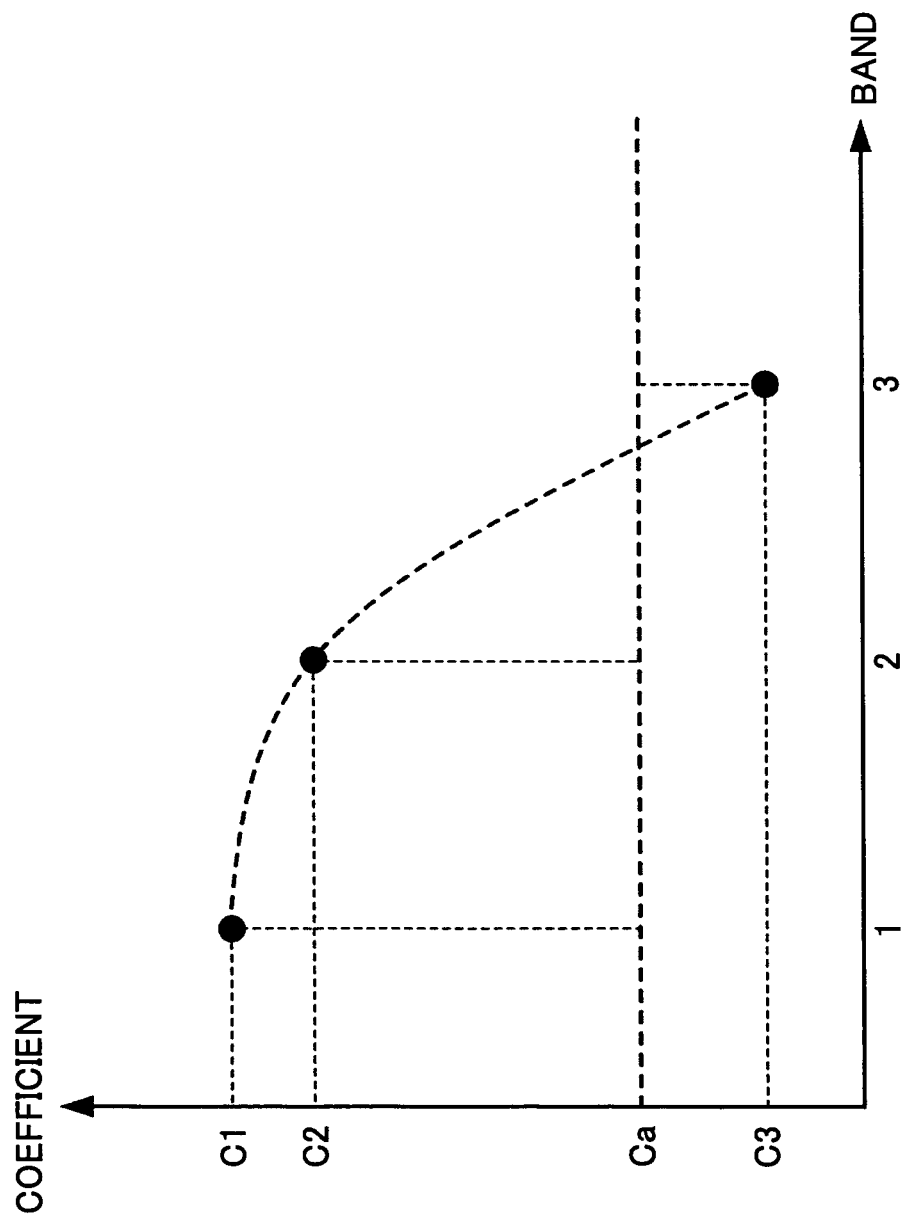
FIG. 9 is a schematic diagram illustrating a determination operation for a coefficient referred to by a gain value computation unit in a radio communication apparatus according to one embodiment of the present invention.

Also, in this embodiment, if frequency hopping is conducted in channels, the respective average values of the coefficients "gradient" and "intercept" suitable for individual bands are stored in a table in the memory 21. In another embodiment, as illustrated in FIG. 9, values of the coefficients "gradient" and "intercept" that are suitable for the individual bands and have the smallest sample variance between the coefficients in consideration of deviations for the individual coefficients suitable for the hopping bands may be stored in the table in the memory 21.

For example, assuming that coefficients suitable for individual bands are C1, C2 and C3, the coefficient Ca for causing the sample variance V in formula (1) as presented below to be minimized is determined as the coefficient for the channel of interest.

$$V=(C1-Ca)^2+(C2-Ca)^2+(C3-Ca)^2 \quad (1)$$

In another embodiment, the individual terms $(C1-Ca)^2$, $(C2-Ca)^2$ and $(C3-Ca)^2$ in formula (1) may be weighted, and the coefficient Ca for causing the weighted sample variance V to be minimized may be stored in the table in the memory 21.

For example, it is assumed that coefficients suitable for individual bands are C1, C2 and C3. If the gain values are set to be larger in the order of C3, C2 and C1, the coefficient Ca for causing the sample variance V in formula (2) as presented below to be minimized may be determined as the coefficient for the channel of interest.

$$V=1\times(C1-Ca)^2+2\times(C2-Ca)^2+3\times(C3-Ca)^2 \quad (1)$$

According to this embodiment, if the coefficient suitable for a certain one of hopping bands is further away from the coefficients suitable for the other bands, it is possible to prevent the gain value for that band from being set at an inappropriate value.

In this embodiment, the weights 1, 2 and 3 are used in formula (2), but any other weights can be used in formula (2).

Figure 10:
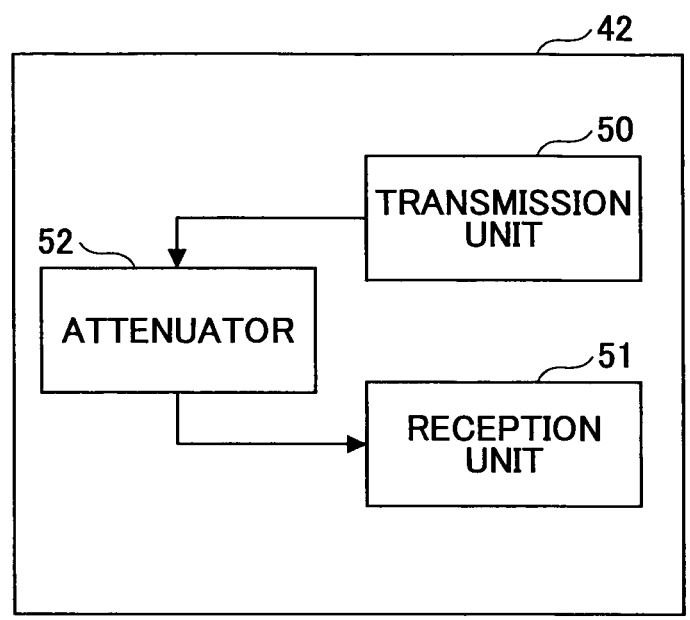
FIG. 10 is a block diagram illustrating a baseband unit in a radio communication apparatus according to another embodiment of the present invention.

Also in the above-stated embodiments, the coefficients "gradient" and "intercept" for different channels are predefined through prior measurement. In another embodiment, as illustrated in FIG. 10, an attenuator 52 may be provided for attenuating a baseband signal supplied from the transmission unit 50 in the baseband unit 42 and supplying the attenuated signal to the reception unit 51, and the coefficients "gradient" and "intercept" for different channels may be stored in the table in the memory 21.

Figure 11:
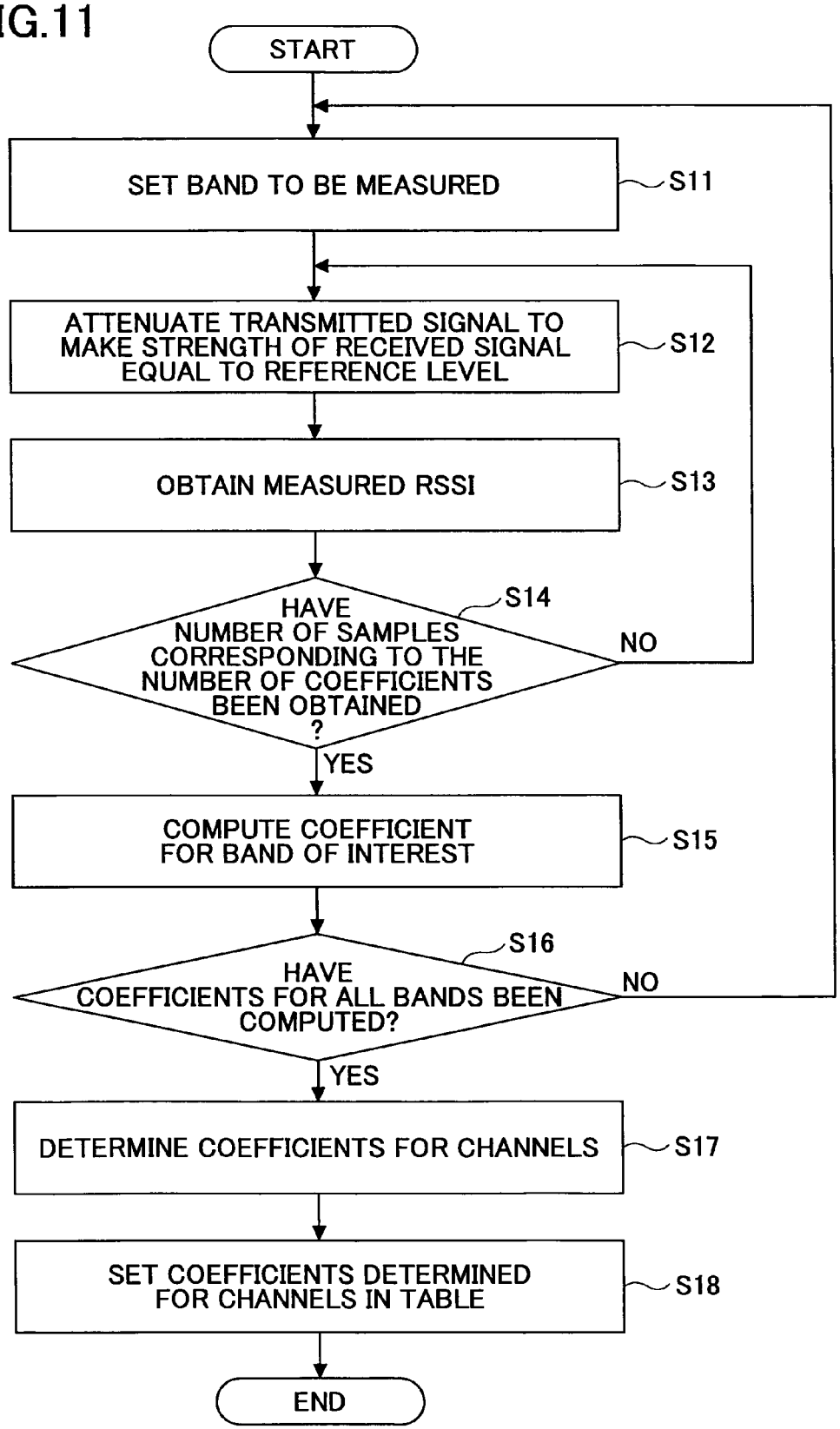
FIG. 11 is a flowchart illustrating a coefficient configuration operation in a radio communication apparatus according to one embodiment of the present invention.
Figure 12:
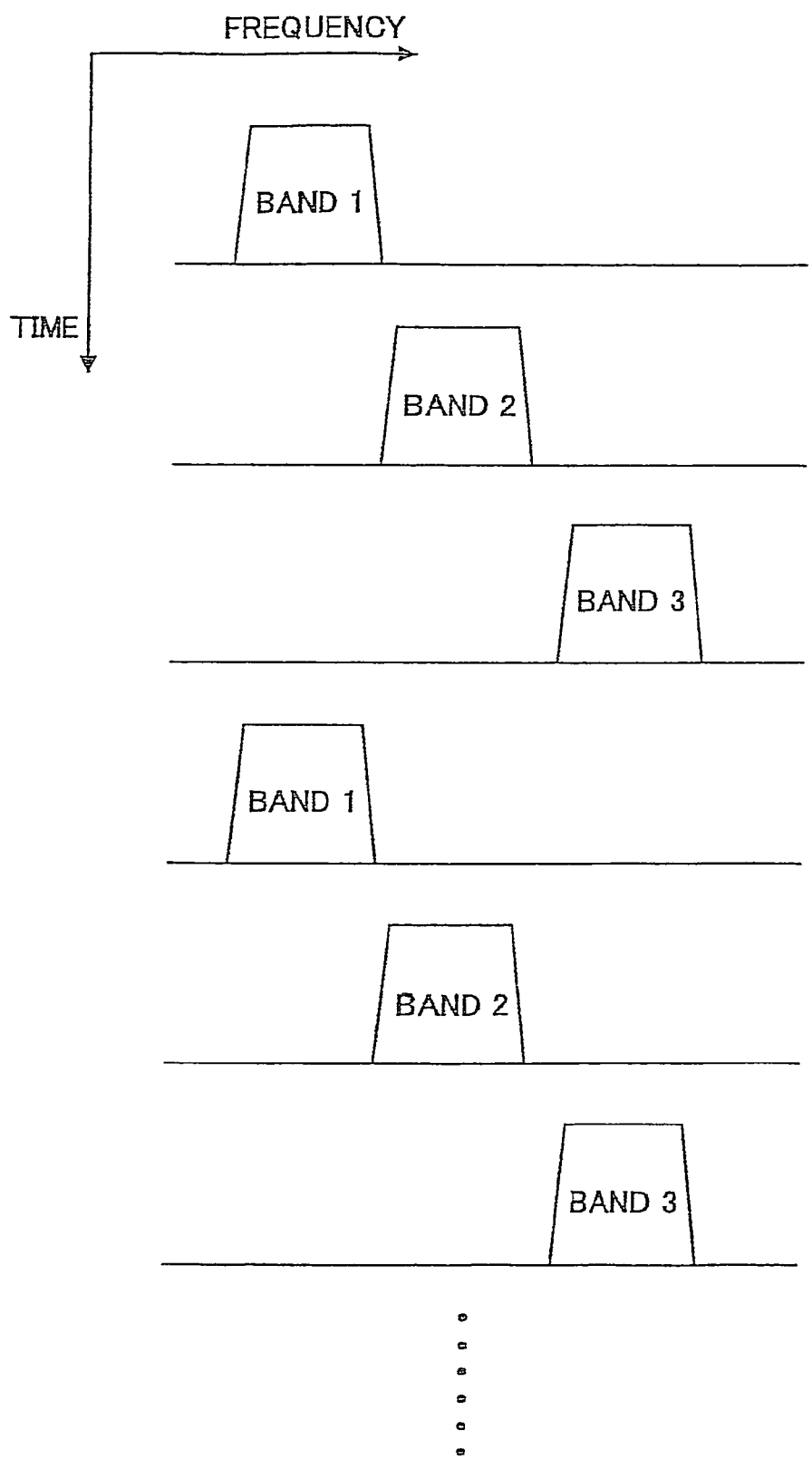
FIG. 12 is a schematic diagram illustrating frequency hopping.

For example, as illustrated in FIG. 11, upon receiving a request from the host controller 2, the sub CPU 20 selects a band to be measured via the MAC unit 22 at step S11.

At step S12, the sub CPU 20 causes the attenuator 52 to attenuate a signal transmitted from the transmission unit 50 such that the strength of the signal received at the reception unit 51 can meet predefined criteria. At step S13, the sub CPU 20 obtains individual RSSIs measured by the RSSI circuit 60.

At step S14, steps S12-S13 are repeated through variations of the reference level and attenuation rate for the attenuator 52 until a number of samples corresponding to the number of coefficients of a linear function for correcting the measured RSSIs into cRSSIs can be obtained. For example, if the gain value computation unit 61 uses a linear function to correct the RSSI into the cRSSI, steps S12-S13 may be executed twice.

Upon obtaining the corresponding number of samples, at step S15, the sub CPU 20 computes coefficients suitable for the band of interest based on the reference levels and the RSSIs.

At step S16, the sub CPU 20 determines whether coefficients suitable for all the bands have been derived. If it is determined that the suitable coefficients have not been derived for all the bands, the process control returns to step S11.

On the other hand, if it is determined that suitable coefficients have been derived for all the bands, the sub CPU 20 determines coefficients for individual channels based on the derived band coefficients at step S17 and stores the determined channel coefficients in the memory 21.

In this manner, the sub CPU 20 may serve as a coefficient determination unit according to the present invention.

As stated above, the radio communication apparatus according to the present invention may be useful in radio communication systems complying with the MB-OFDM scheme. In particular, if the signal strength measurement circuit has different characteristics for individual bands, the radio communication apparatus may be advantageous.

The present invention is not limited to the specifically disclosed embodiments, and variations and modifications may be made without departing from the scope of the present invention.

The present application is based on Japanese Priority Patent Application No. 2008-028922 filed on Feb. 8, 2008, the entire contents of which are hereby incorporated herein by reference.

The invention claimed is:

1. A radio communication apparatus comprising,
an amplifier configured to amplify a signal received via one of multiple channels including a channel where frequency hopping is conducted;
a signal strength measurement circuit configured to measure a signal strength of the received signal;
a gain value computation unit configured to compute a gain value for the amplifier based on the signal strength measured by the signal strength measurement circuit, wherein the gain value computation unit is configured to use values specific to the respective channels as coefficients of a function to compute the gain value;
a transmission unit configured to transmit a baseband signal in consecutively changed frequency bands;
an attenuator configured to attenuate the baseband signal to a reference level;
an attenuation rate configuration unit configured to set an attenuation rate of the attenuator; and
a coefficient determination unit configured to determine the coefficients of each of the multiple channels, wherein the signal strength measurement circuit is configured to measure a signal strength of the baseband signal attenuated by the attenuator as the received signal, and
the coefficient determination unit is configured to determine the coefficients suitable for each of the frequency bands of the channels based on the signal strength of the baseband signal attenuated by the attenuator and the reference level.

2. The radio communication apparatus as claimed in claim 1, wherein
the gain value computation unit is configured to use a linear function to compute the gain value.

3. The radio communication apparatus as claimed in claim 1, further comprising:
a register complying with a WiMedia Media Access Controller Physical Layer (MAC-PHY) interface specification; and
a Media Access Controller (MAC) unit configured to write a value in the register, wherein
the MAC unit is configured to write the coefficients in the register prior to writing in the register a value indicative of the channel via which the signal is received, and
the gain value computation unit is configured to use the coefficients written in the register as the coefficients of the function to compute the gain value.

4. The radio communication apparatus as claimed in claim 3, wherein
the MAC unit is configured to write the coefficients in a range in the register in the WiMedia MAC-PHY interface specification, the range being where a vendor is allowed to assign proprietary values.

5. The radio communication apparatus as claimed in claim 3, further comprising:
a table storage unit configured to store a table including correspondence between the channels and the coefficients, wherein
the MAC unit is configured to write the coefficients in the register based on the table in the table storage unit.

6. The radio communication apparatus as claimed in claim 1, further comprising:
an analog-to-digital conversion unit configured to perform analog-to-digital conversion on the received signal, wherein
the signal strength measurement circuit is configured to measure signal strength of the received analog signal, and
the amplifier is configured to amplify the received digital signal converted by the analog-to-digital conversion unit.

7. The radio communication apparatus as claimed in claim 1, wherein
the signal strength measurement circuit is configured to measure signal strength of the received analog signal, and
the amplifier is configured to amplify the received analog signal.

8. A radio communication apparatus comprising:
an amplifier configured to amplify a signal received via one of multiple channels including a channel where frequency hopping is conducted;
a signal strength measurement circuit configured to measure a signal strength of the received signal;
a gain value computation unit configured to compute a gain value for the amplifier based on the signal strength measured by the signal strength measurement circuit, wherein the gain value computation unit is configured to use values specific to the respective channels as coefficients of a function to compute the gain value; and
a coefficient determination unit configured to, determine the coefficients such that the coefficients are suitable for a frequency band of the channel, if the frequency hopping is not conducted on the channel, and determine the coefficients of the channel such that the average value of the coefficients are suitable for different hopping frequency bands of the channel, if the frequency hopping is conducted on the channel.

9. A radio communication apparatus comprising:
an amplifier configured to amplify a signal received via one of multiple channels including a channel where frequency hopping is conducted;
a signal strength measurement circuit configured to measure a signal strength of the received signal;
a gain value computation unit configured to compute a gain value for the amplifier based on the signal strength measured by the signal strength measurement circuit, wherein the gain value computation unit is configured to use values specific to the respective channels as coefficients of a function to compute the gain value; and
a coefficient determination unit configured to determine, the coefficients such that the coefficients are suitable for a frequency band of the channel, if the frequency hopping is not conducted on the channel, and determine the coefficients of the channel based on a sample variance suitable for different hopping frequency bands of the channel, if the frequency hopping is conducted on the channel.

10. The radio communication apparatus as claimed in claim 9, wherein
the coefficient determination unit is configured to weight individual terms of the sample variance.

* * * * *